(12) United States Patent
Chang et al.

(10) Patent No.: US 11,227,848 B2
(45) Date of Patent: Jan. 18, 2022

(54) CHIP PACKAGE ARRAY, AND CHIP PACKAGE

(71) Applicant: VIA Alliance Semiconductor Co., Ltd., Shanghai (CN)

(72) Inventors: Wen-Yuan Chang, New Taipei (TW); Wei-Cheng Chen, New Taipei (TW); Hsueh-Chung Shelton Lu, New Taipei (TW)

(73) Assignee: VIA Alliance Semiconductor Co., Ltd., Shanghai (CN)

( * ) Notice: Subject to any disclaimer, the term of this patent is extended or adjusted under 35 U.S.C. 154(b) by 191 days.

(21) Appl. No.: 15/636,644

(22) Filed: Jun. 29, 2017

(65) Prior Publication Data

US 2018/0061788 A1 Mar. 1, 2018

Related U.S. Application Data

(60) Provisional application No. 62/380,960, filed on Aug. 29, 2016.

(30) Foreign Application Priority Data

May 11, 2017 (TW) .................................. 106115539

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 21/56* | (2006.01) |

(Continued)

(52) U.S. Cl.
CPC ............ *H01L 24/04* (2013.01); *H01L 21/561* (2013.01); *H01L 24/14* (2013.01); *H01L 24/19* (2013.01); *H01L 24/20* (2013.01); *H01L 24/97* (2013.01); *H01L 25/04* (2013.01); *H01L 21/568* (2013.01); *H01L 23/3128* (2013.01); *H01L 27/00* (2013.01); *H01L 2224/04105* (2013.01); *H01L 2224/12105* (2013.01); *H01L 2224/96* (2013.01); *H01L 2224/97* (2013.01);

(Continued)

(58) Field of Classification Search
CPC ......... H01L 24/04; H01L 24/14; H01L 25/04; H01L 27/00
See application file for complete search history.

(56) References Cited

U.S. PATENT DOCUMENTS

2010/0301474 A1* 12/2010 Yang ..................... H01L 24/29
257/737
2012/0153493 A1* 6/2012 Lee ......................... H01L 25/16
257/774

(Continued)

*Primary Examiner* — Meiya Li
(74) *Attorney, Agent, or Firm* — JCIPRNET (57) ABSTRACT

A chip package array including a plurality of chip packages is provided. The chip packages are suitable for array arrangement to form the chip package array. Each of the chip packages includes a redistribution structure, a supporting structure, a chip, and an encapsulated material. The supporting structure is disposed on the redistribution structure and has an opening. The chip is disposed on the redistribution structure and located in the opening. The encapsulated material is located between the opening and the chip, wherein the encapsulated material is filled between the opening and the chip, and the chip and the supporting structure are respectively connected to the redistribution structure.

20 Claims, 11 Drawing Sheets

(51) Int. Cl.
*H01L 25/04* (2014.01)
*H01L 23/31* (2006.01)
*H01L 27/00* (2006.01)

(52) U.S. Cl.
CPC ............... *H01L 2924/18162* (2013.01); *H01L 2924/19105* (2013.01); *H01L 2924/3511* (2013.01)

(56) References Cited

U.S. PATENT DOCUMENTS

| | | | | |
|---|---|---|---|---|
| 2015/0147849 A1* | 5/2015 | Shin | ........................ | H01L 24/19 438/113 |
| 2016/0005628 A1* | 1/2016 | Yap | ........................ | H01L 21/561 257/774 |
| 2016/0336249 A1* | 11/2016 | Kang | .................. | H01L 23/3128 |

* cited by examiner

CHIP PACKAGE ARRAY, AND CHIP PACKAGE

CROSS-REFERENCE TO RELATED APPLICATION

This application claims the priority benefits of U.S. provisional application Ser. No. 62/380,960, filed on Aug. 29, 2016, and Taiwan application serial no. 106115539, filed on May 11, 2017. The entirety of each of the above-mentioned patent applications is hereby incorporated by reference herein and made a part of this specification.

BACKGROUND OF THE INVENTION

Field of the Invention

The invention relates to a chip package structure, and more particularly, to a chip package array and a chip package.

Description of Related Art

In the semiconductor industry, the production of integrated circuits (IC) can be mainly divided into three phases: IC design, IC process, and IC package. Therefore, a die is made by steps such as wafer manufacture, circuit design, photomask manufacture, and wafer cutting. The die is electrically connected to a carrier such as a lead frame or a dielectric layer via a method such as wire bonding or flip chip bonding, such that the bonding pads of the die can be redistributed in the periphery of the chip or below the active surface of the chip. Next, an encapsulated material covers the die to protect the die.

SUMMARY OF THE INVENTION

The invention provides a chip package array that can increase structural strength and lower production cost of the process.

The invention provides a chip package that can increase structural strength and lower production cost of the process.

The invention further provides a chip package array including a plurality of chip packages. The chip packages are suitable for array arrangement to form the chip package array. Each of the chip packages includes a redistribution structure, a supporting structure, a chip, and an encapsulated material. The supporting structure is disposed on the redistribution structure and has an opening. The chip is disposed on the redistribution structure and located in the opening. The encapsulated material is located between the opening and the chip, wherein the encapsulated material is filled between the opening and the chip, and the chip and the supporting structure are respectively connected to the redistribution structure.

The invention further provides a chip package including a redistribution structure, a supporting structure, a chip, and an encapsulated material. The supporting structure is disposed on the redistribution structure and has an opening. The chip is disposed on the redistribution structure and located in the opening. The encapsulated material is located between the opening and the chip, wherein the encapsulated material is filled between the opening and the chip, and the chip and the supporting structure are respectively connected to the redistribution structure.

Based on the above, in the chip package process of the invention, since a supporting structure is disposed in the peripheral region of each of the chip packages of the chip package array, warping occurring during the packaging process can be alleviated, and the structural strength of the chip package array can be increased and production cost of the process can be lowered, such that the yield of the chip package is increased. Moreover, the disposition of the supporting structure can also improve the overall structural strength of each of the chip packages.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
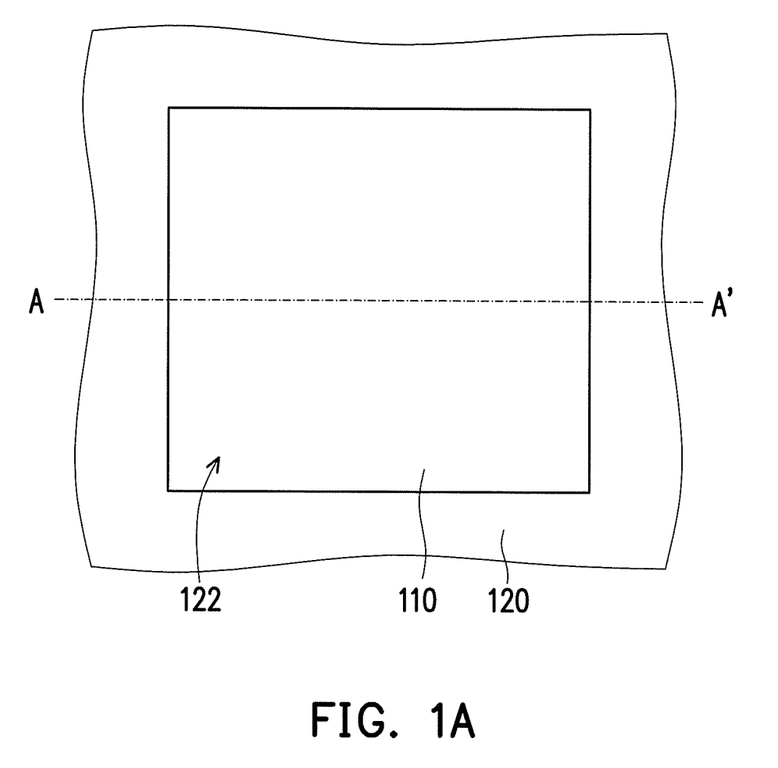
FIG. 1A to FIG. 1F are top views of a chip package process according to an embodiment of the invention.
Figure 1F:
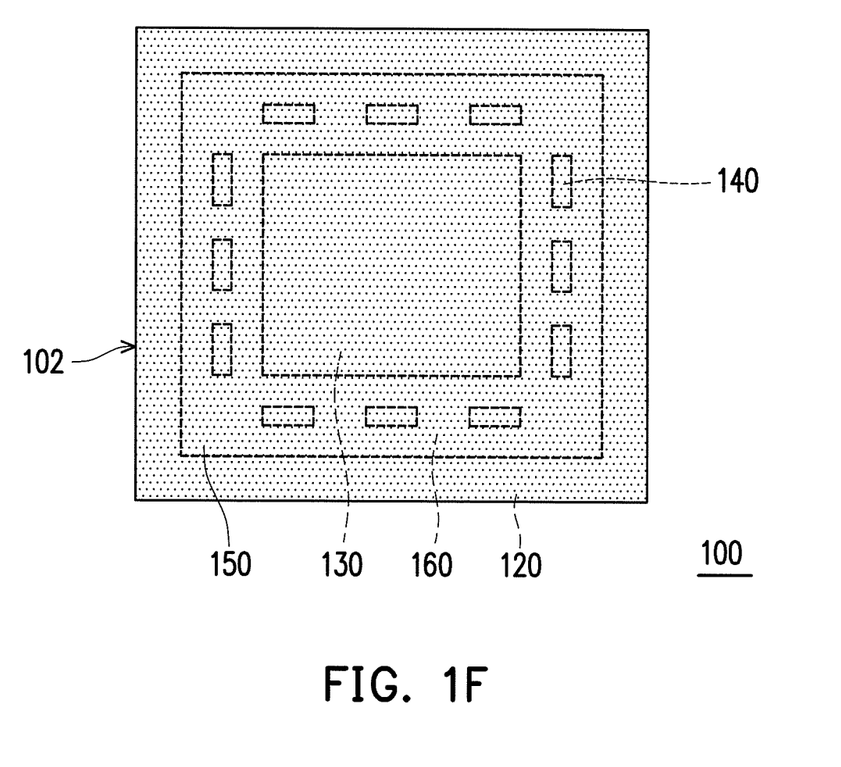
Figure 2A:
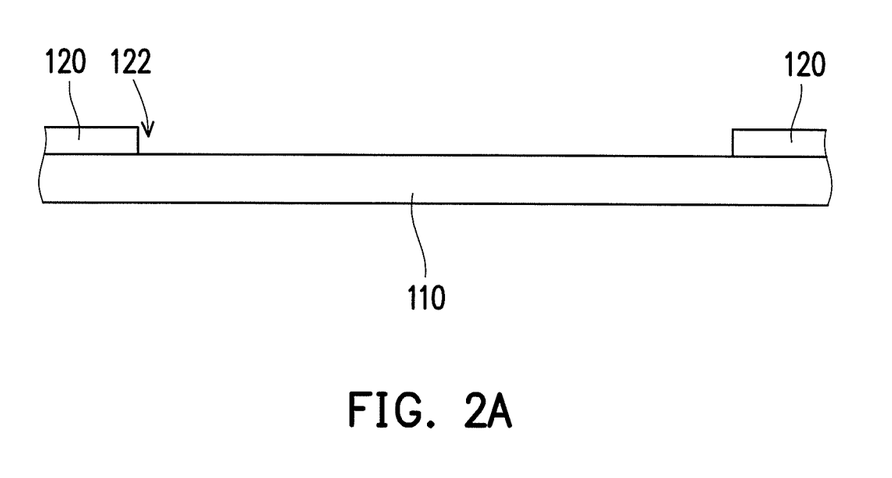
FIG. 2A to FIG. 2F are respectively cross-sectional views of the structure of FIG. 1A to FIG. 1F along line A-A' of FIG. 1A.
Figure 2F:
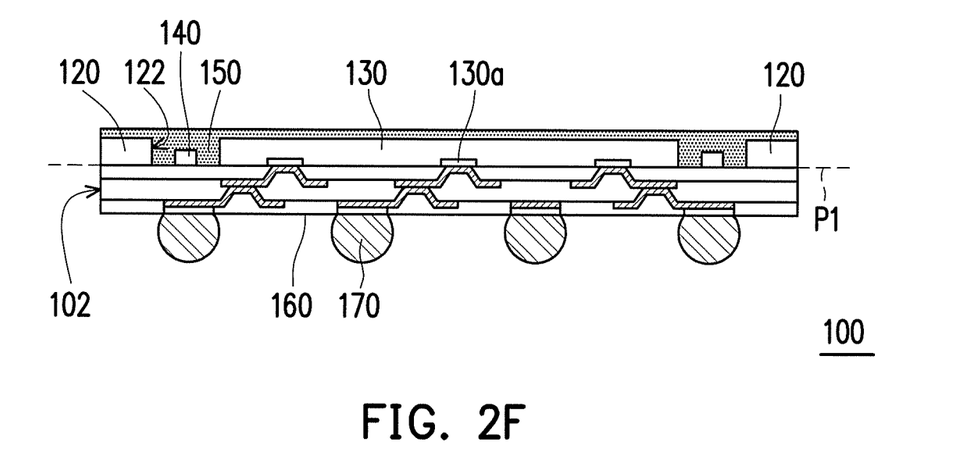
Figure 3A:
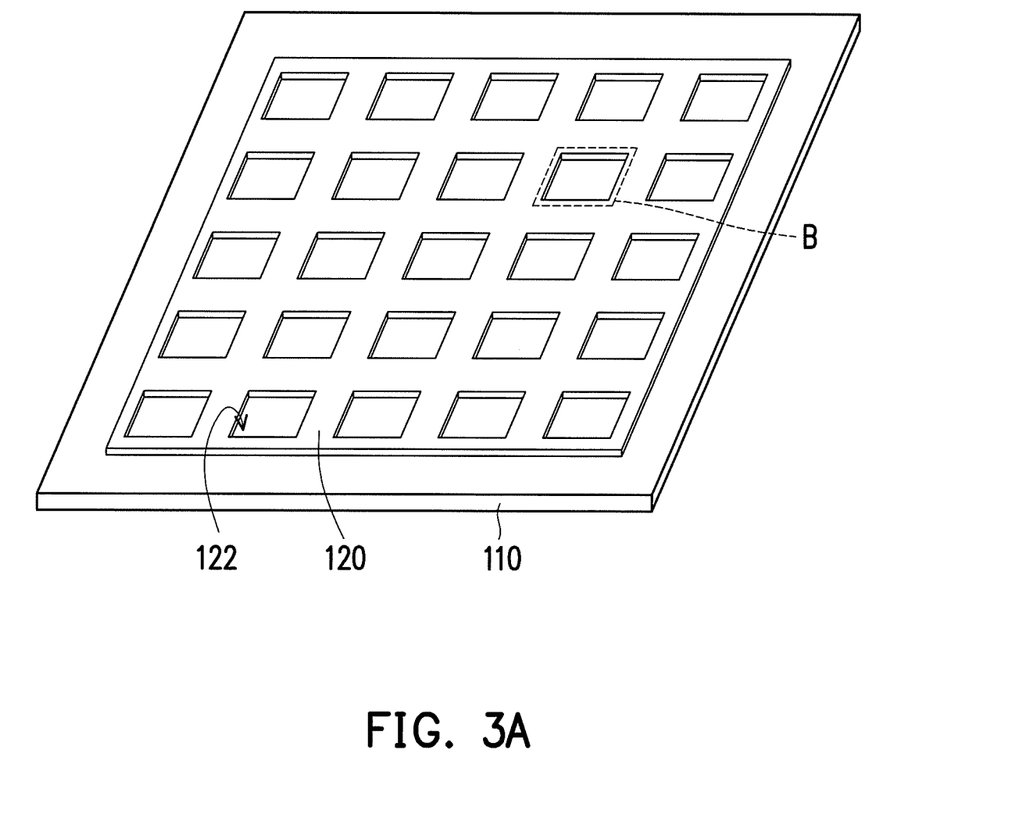
FIG. 3A is a perspective view of the structures of FIG. 1A and FIG. 2A in complete state.

Referring to FIG. 1A, FIG. 2A, and FIG. 3A, the structures of FIG. 1A and FIG. 2A in complete state are shown in FIG. 3A, i.e., the structure of FIG. 3A is partially shown in FIG. 1A and FIG. 2A. In the chip package process of the present embodiment, a supporting structure 120 and a carrier plate 110 are provided. The supporting structure 120 is disposed on the carrier plate 110. The supporting structure 120 has a plurality of openings 122. Specifically, in the present embodiment, the supporting structure 120 is one reticular structure, such as one reticular reinforced supporting member. As a result, the supporting structure having a plurality of openings and the carrier plate can alleviate warping occurring during the packaging process, and the effect is more significant for a fan-out wafer level package (FOWLP) or a fan-out panel level package (FOPLP) having a larger size. Moreover, via the supporting structure 120 having the plurality of openings 122 and the carrier plate 110, the structural strength of the chip package array 50 (shown in FIG. 3C) can be increased and the production cost of the process can be lowered, such that the yield of the chip package 100 (shown in FIG. 1F and FIG. 2F) can be increased.

Figure 1B:
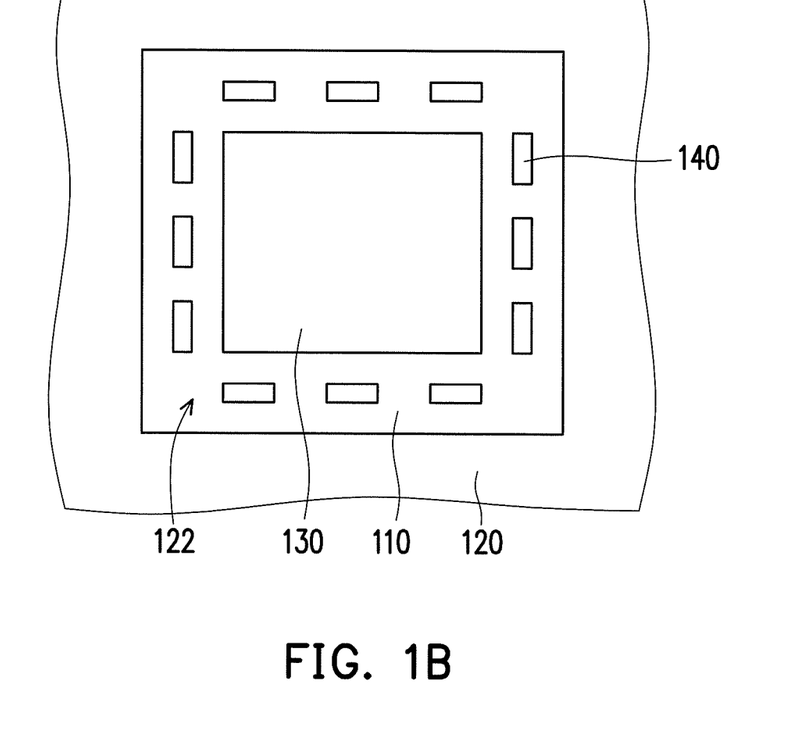
Figure 2B:
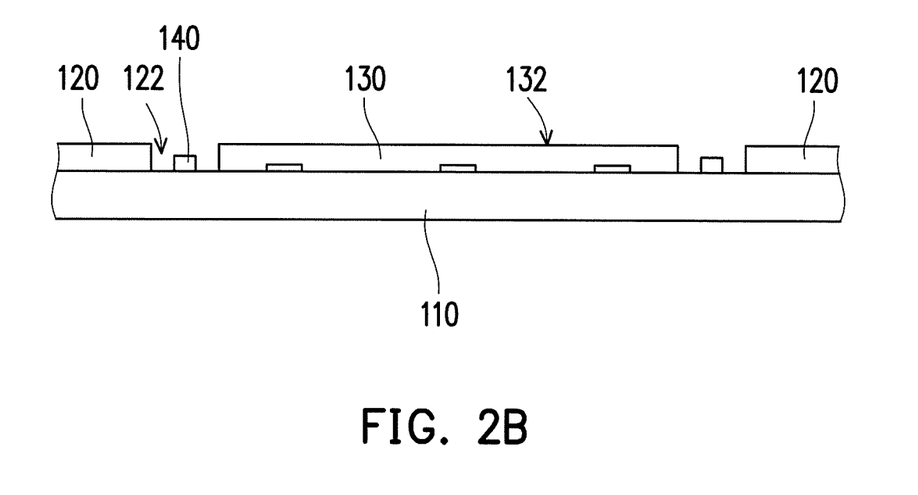
Figure 3B:
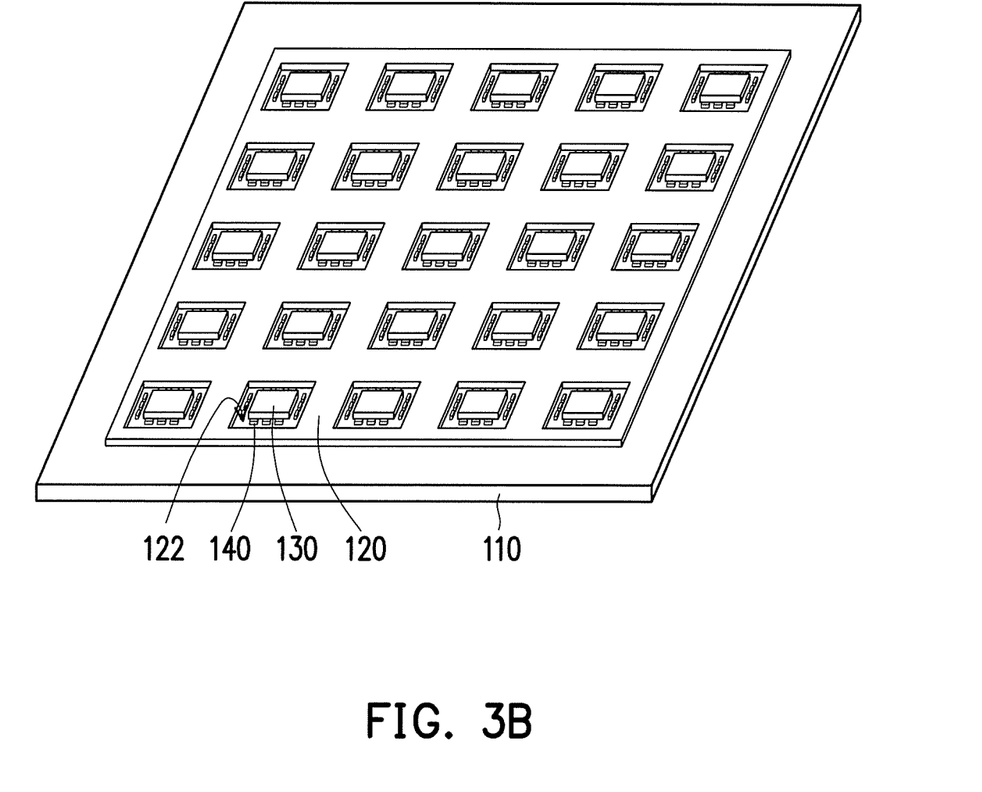
FIG. 3B is a perspective view of the structures of FIG. 1B and FIG. 2B in complete state.

Referring to FIG. 1B, FIG. 2B, and FIG. 3B, the structures of FIG. 1B and FIG. 2B in complete state are shown in FIG. 3B, i.e., the structure of FIG. 3B is partially shown in FIG.

1B and FIG. 2B. After the above steps, a plurality of chips 130 is disposed on the carrier plate 110, wherein the chips 130 are respectively located in a plurality of openings 122 of the supporting structure 120. In the present embodiment, one chip 130 is disposed in one opening 122, and the invention is not limited thereto. In other embodiments, a plurality of chips can be disposed in one opening and disposed in the corresponding opening via a stacking method. In the present embodiment, the step of disposing the chips 130 on the carrier plate 110 further includes disposing a plurality of passive elements 140 on the carrier plate 110 that are located between the chips 130 and the supporting structure 120. For instance, one or a plurality of the passive elements 140 can be disposed in each of the openings 122 to meet electrical requirements.

Figure 1C:
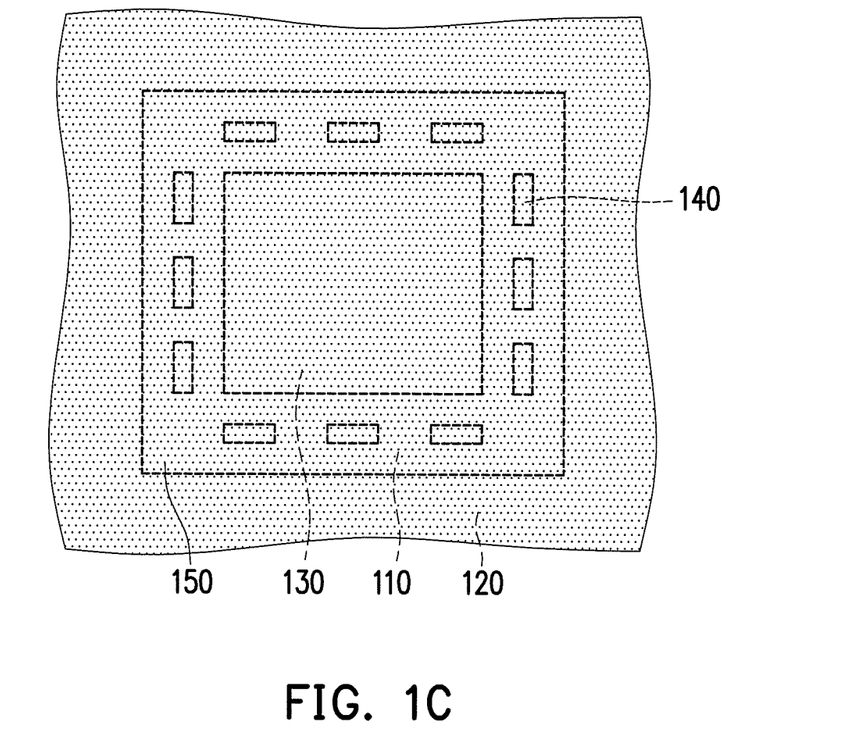
Figure 2C:
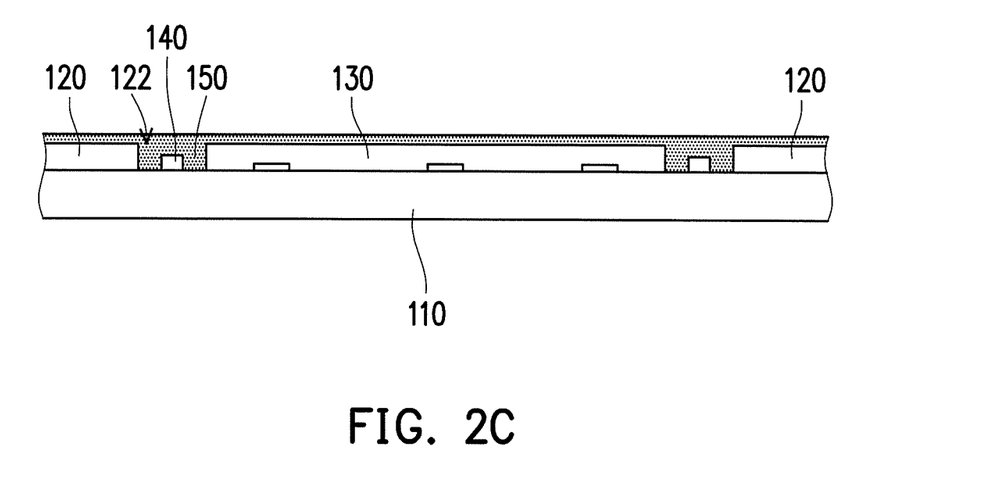

Referring to FIG. 1C and FIG. 2C, after the steps above, an encapsulated material 150, such as molding compound, is formed to cover the supporting structure 120 and the chips 130, wherein the supporting structure 120 and the chips 130 are located between the encapsulated material 150 and the carrier plate 110, and the encapsulated material 150 is filled between the openings 122 and the chips 130. In other words, in this step, the encapsulated material 150 is filled on the supporting structure 120 and completely covers the supporting structure 120 and the chips 130 such that each of the openings 122 in the supporting structure 120 is completely filled with the encapsulated material 150 to fix the supporting structure 120 and the chips 130. Moreover, the encapsulated material 150 also completely covers the passive elements 140.

Figure 1D:
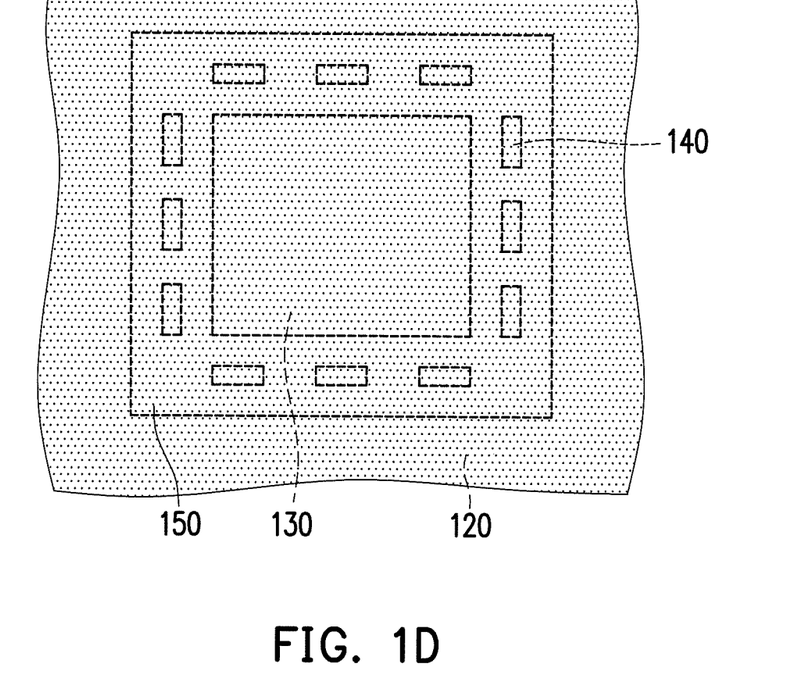
Figure 2D:
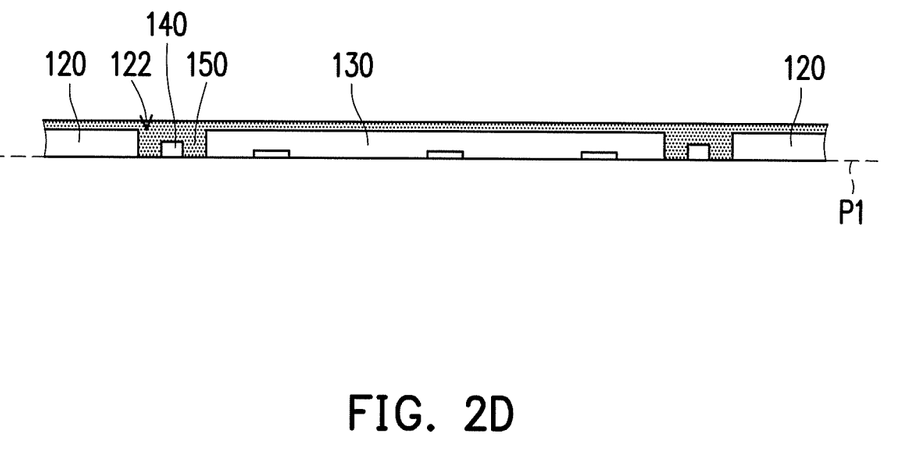

Referring to FIG. 1D and FIG. 2D, after the steps above, the carrier plate 110 is removed. Since the encapsulated material 150 is completely filled in each of the openings 122, the supporting structure 120 and the chips 130 are fixedly connected to each other via the encapsulated material 150 and do not separate. At this point, the supporting structure 120, the chips 130, the passive elements 140, and the encapsulated material 150 form a first reference plane P1, i.e., the supporting structure 120, the chips 130, the passive elements 140, and the encapsulated material 150 are coplanar.

Figure 1E:
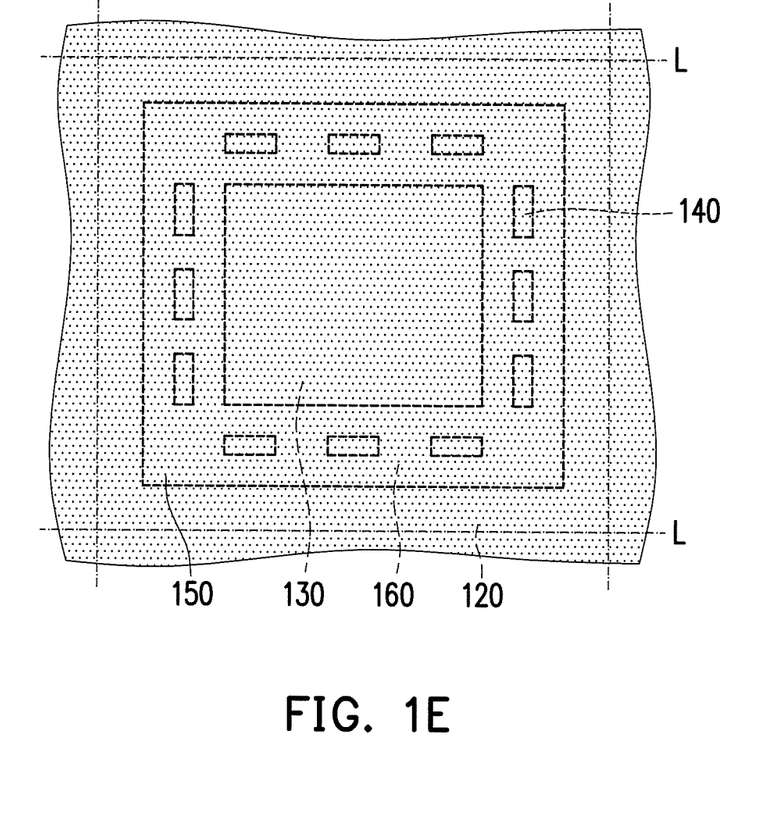
Figure 2E:
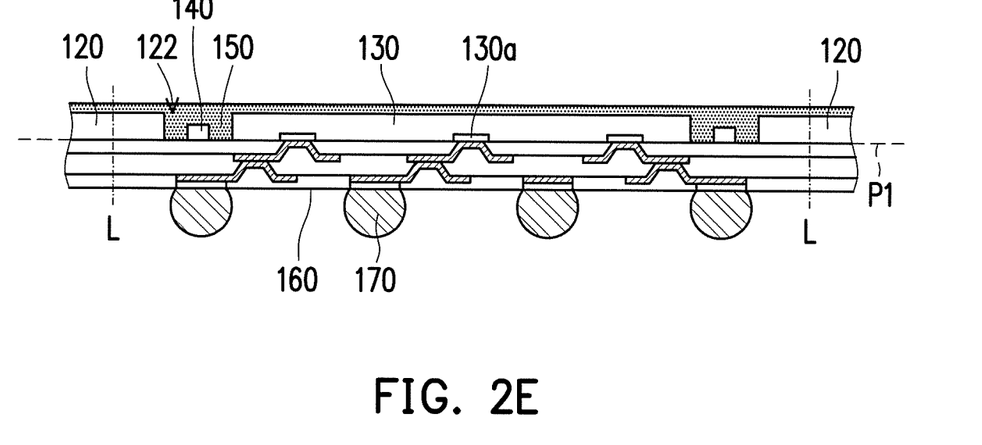
Figure 3C:
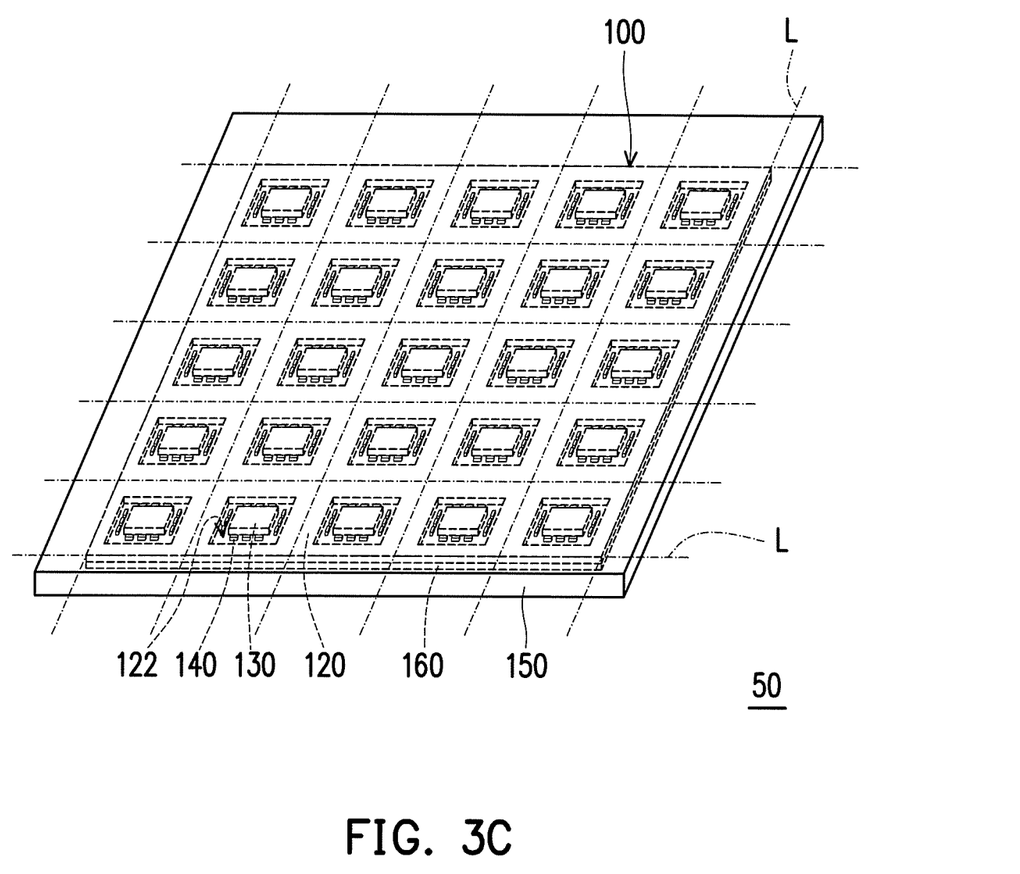
FIG. 3C is a perspective view of the structures of FIG. 1E and FIG. 2E in complete state.

Referring to FIG. 1E, FIG. 2E, and FIG. 3C, the structures of FIG. 1E and FIG. 2E in complete state are shown in FIG. 3C, i.e., the structure of FIG. 3C is partially shown in FIG. 1E and FIG. 2E. After the steps above, the redistribution structure 160 is disposed on the supporting structure 120 and directly connected to the chips 130, and via the disposition of the redistribution structure 160, the signal originally disposed on the chips 130 is fanned-out outside the projection region of the chips 130 of the redistribution structure 160, such that the flexibility of signal disposition of the chips 130 is increased. Moreover, the conductive layer portion of the redistribution structure 160 can be directly electrically connected to a pad 130a on the chips 130 without the addition of bumps. In other words, the redistribution structure 160 is disposed on the first reference plane P1 and directly connected to the chips 130. Moreover, a plurality of solder balls 170 can be further disposed on the redistribution structure 160, and the redistribution structure 160 is located between the chips 130 and the solder balls 170. At this point, a chip package array 50 shown in FIG. 3C is completed, and the chip package array 50 contains a plurality of uncut chip packages 100.

Referring to FIG. 1F and FIG. 2F, after the steps above, the chip package array 50 is cut along a plurality of cutting lines L between the plurality of openings 122 to form a single chip package 100 as shown in FIG. 1F and FIG. 2F. In other words, each of the chip packages 100 formed by cutting the supporting structure 120 along the cutting lines L has a portion of the supporting structure 120, and therefore the supporting structure 120 is one annular reinforced supporting member for a single chip package 100 and can increase the overall structural strength of the chip package 100. More specifically, since the annular reinforced supporting member is formed by cutting along the cutting lines L, the reinforced supporting member is exposed at a side 102 of a single chip package 100, and therefore better protection is provided to the peripheral region of the chip package 100. Similarly, the encapsulated material 150 and the redistribution structure 160 are also cut along the cutting lines L such that a portion of the encapsulated material 150 and a portion of the redistribution structure 160 are exposed at the side 102 of a single chip package 100.

Referring further to FIG. 1E, FIG. 2E, and FIG. 3C, specifically, in the present embodiment, the chip package array 50 includes a plurality of chip packages 100, and the chip packages 100 are suitable for array arrangement to form the chip package array 50 as shown in FIG. 3C. Each of the chip packages 100 includes a redistribution structure 160, a supporting structure 120, a chip 130, and an encapsulated material 150. The supporting structure 120 is disposed on the redistribution structure 160 and has an opening 122. The chip 130 is disposed on the redistribution structure 160 and located in the opening 122. The encapsulated material 150 is located between the opening 122 and the chip 130, wherein the encapsulated material 150 is filled between the opening 122 and the chip 130, and the chip 130 and the supporting structure 120 are respectively directly connected to the redistribution structure 160. In other words, the chip packages 100 are formed by cutting the chip package array 50, and therefore the redistribution structure 160, the supporting structure 120, and the encapsulated material 150 are also cut and formed in each of the chip packages 100. Since the supporting structure 120 is disposed in the peripheral region of each of the chip packages 100 of the chip package array 50, warping occurring during the packaging process of the chip package array 50 can be alleviated, and the structural strength of the chip package array 50 can be increased and production cost of the process can be lowered, such that the yield of the chip packages 100 is increased. Moreover, the disposition of the supporting structure 120 can also improve the overall structural strength of each of the chip packages 100.

Referring further to FIG. 1F and FIG. 2F, specifically, in the present embodiment, the chip packages 100 include a redistribution structure 160, a supporting structure 120, a chip 130, and an encapsulated material 150. The supporting structure 120 is disposed on the redistribution structure 160 and has an opening 122. The chip 130 is disposed on the redistribution structure 160 and located in the opening 122. The encapsulated material 150 is located between the opening 122 and the chip 130, wherein the encapsulated material 150 is filled between the opening 122 and the chip 130, and the chip 130 and the supporting structure 120 are respectively directly connected to the redistribution structure 160. In particular, the chip packages 100 are formed by cutting the chip package array 50 (as shown in FIG. 3C), and therefore the redistribution structure 160, the supporting structure 120, and the encapsulated material 150 are also cut and formed in each of the chip packages 100. Since the supporting structure 120 is disposed in the peripheral region of the chip packages 100, the overall structural strength of the chip packages 100 can be improved.

Figure 4A:
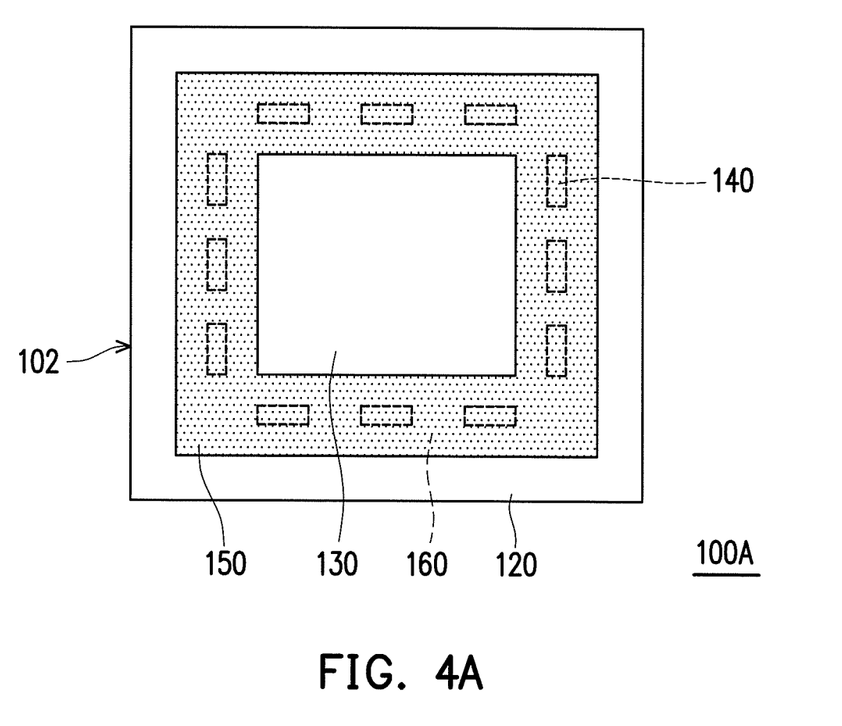
FIG. 4A is a top view of a chip package of another embodiment of the invention.
Figure 4B:
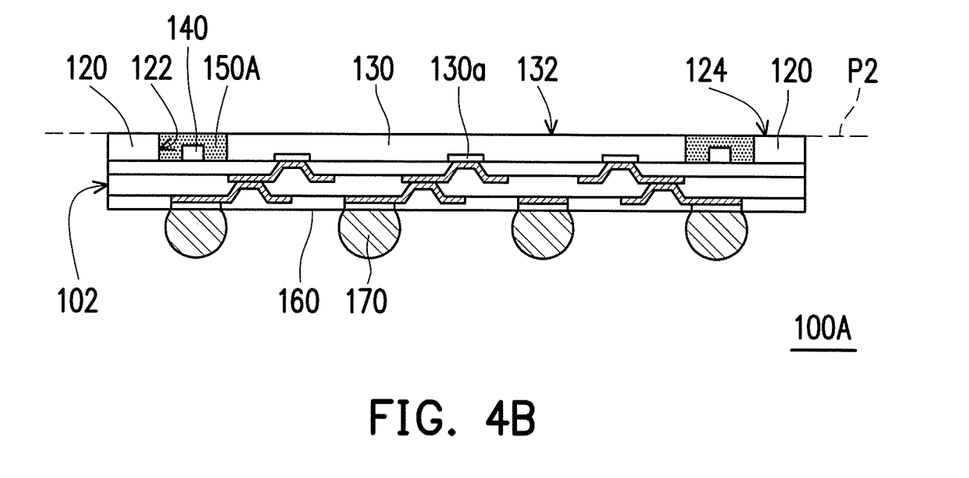
FIG. 4B is a cross-sectional view of a chip package of another embodiment of the invention.

Referring to FIG. 4A and FIG. 4B, a chip package 100A of the present embodiment is similar to the chip package 100 of FIG. 1F and FIG. 2F, and the main difference between the two is the disposition of an encapsulated material 150A. Before the step of cutting the chip package array 50, a portion of the encapsulated material 150 is removed to form the encapsulated material 150A to expose the chips 130. Specifically, before the step of FIG. 2F, a portion of the encapsulated material 150 located on the supporting structure 120 and the chips 130 is removed and the encapsulated material 150A located between the supporting structure 120 and the chips 130 is kept. In the present embodiment, a top surface 124 of the supporting structure 120 away from the redistribution structure 160 is coplanar with a first surface 132 of the chips 130 away from the redistribution structure 160, i.e., both are located on a second reference plane P2. As a result, the chips 130 can be exposed outside the chip package 100A to be in contact with a heat conductor such that the chip package 100A has better heat dissipation.

Figure 5:
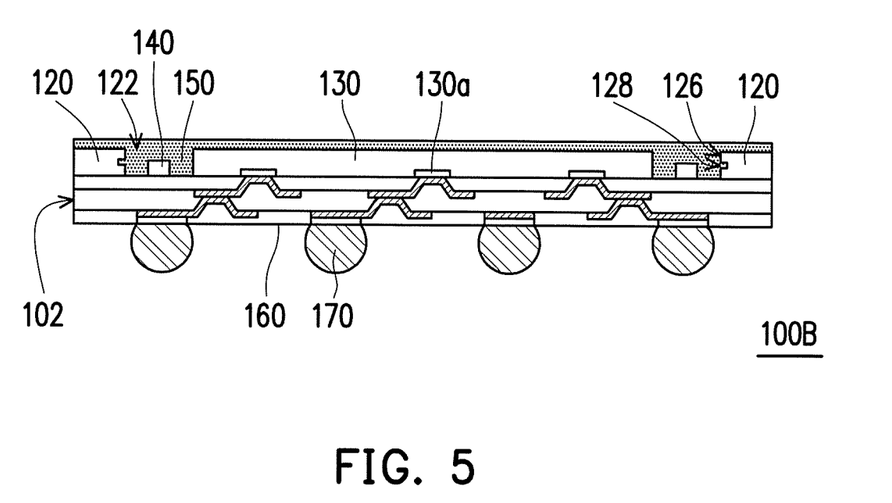
FIG. 5 is a cross-sectional view of a chip package of yet another embodiment of the invention.

Referring to FIG. 5, a chip package 100B of the present embodiment is similar to the chip package 100 of FIG. 2F, and the main differences between the two are, for instance, the opening 122 of the present embodiment has an inner surface 126, the inner surface 126 has at least one groove 128, and the encapsulated material 150 is completely filled in the groove 128. As a result, the overall structural strength of the chip package 100B can be ensured by completely filling the encapsulated material 150 in the groove 128. Moreover, in another embodiment, a portion of the encapsulated material 150 can be further removed to expose the chips 130 similarly as shown in FIG. 4A and FIG. 4B.

Figure 6:
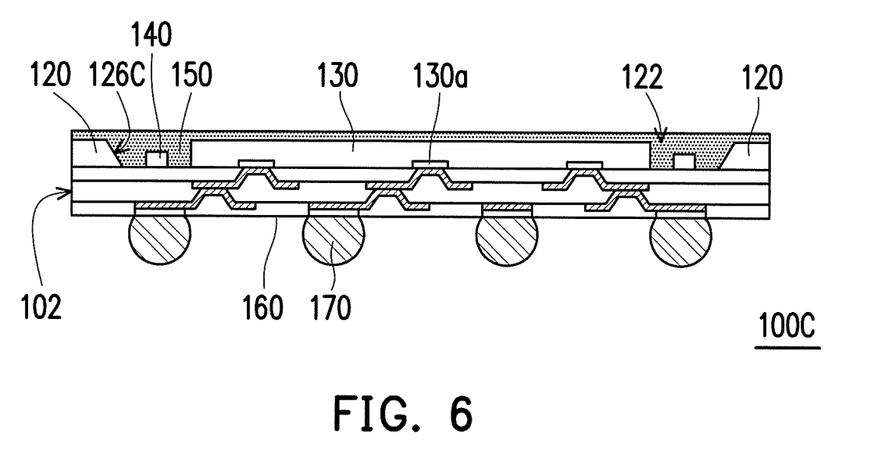
FIG. 6 is a cross-sectional view of a chip package of still yet another embodiment of the invention.

Referring to FIG. 6, a chip package 100C of the present embodiment is similar to the chip package 100 of FIG. 2F, and the main differences between the two are, for instance, the opening 122 of the present embodiment has an inner surface 126C, and the inner surface 126C is inclined in a direction away from the chips 130 such that the encapsulated material 150 is extended above the inner surface 126C. In other words, due to the inclined design of the inner surface 126C, the supporting structure 120 can be covered via the extension of the encapsulated material 150, such that the supporting structure 120 and the redistribution structure 160 are more tightly connected and are not readily fallen off. As a result, the overall structural strength of the chip package 100C can be ensured by covering the inner surface 126C of the encapsulated material 150. Moreover, in another embodiment, a portion of the encapsulated material 150 can be further removed to expose the chips 130 similarly as shown in FIG. 4A and FIG. 4B.

Based on the above, in the chip package process of the invention, since a supporting structure is disposed in the peripheral region of each of the chip packages of the chip package array (at this point, the supporting structure is exposed on a side of a single the chip package), warping occurring during the packaging process can be alleviated, and the structural strength of the chip package array can be increased and production cost of the process can be lowered, such that the yield of the chip package is increased. Moreover, the disposition of the supporting structure can also improve the overall structural strength of each of the chip packages.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A chip package array, comprising:
   a plurality of chip packages suitable for an array arrangement to form the chip package array, each of the plurality of chip packages comprising:
   a redistribution structure;
   a supporting structure formed in one continuous piece, disposed on the redistribution structure and having an opening, wherein the supporting structure comprises a top surface and a bottom surface opposite to the top surface, a first side surface connected with a first end of each of the top surface and the bottom surface and a second side surface connected with a second end of each of the top surface and the bottom surface, and a maximum thickness from the first side surface to the second side surface is greater than a maximum thickness from the top surface to the bottom surface;
   a chip disposed on the redistribution structure and located in the opening; and
   an encapsulated material located between the opening and the chip, wherein the encapsulated material is filled between the opening and the chip, and the chip, the supporting structure are respectively connected to the redistribution structure, the encapsulated material completely covers the top surface and the first side surface of the supporting structure and a top surface and side surfaces of the chip, and the supporting structure, the chip and the encapsulated material form a common plane, the encapsulated material directly contacts with the entire top surface and the first side surface of the supporting structure and the top surface and the side surfaces of the chip, the chip and the supporting structure have the same thickness, the top surface of the chip is coplanar with the top surface of the supporting structure, the top surface of the chip faces away from the redistribution structure and is an inactive surface, and a bottom surface of the chip faces toward the redistribution structure and is an active surface.

2. The chip package array of claim 1, wherein the chip comprises at least one pad, and the redistribution structure is directly connected to the at least one pad.

3. The chip package array of claim 1, wherein at least one of the chip and the supporting structure is exposed from the encapsulated material.

4. The chip package array of claim 1, wherein the opening has an inner surface, the inner surface has a groove, and the encapsulated material is completely filled in the groove.

5. The chip package array of claim 1, wherein the opening has an inner surface, and the inner surface is inclined in a direction away from the chip such that the encapsulated material is extended above the inner surface.

6. The chip package array of claim 1, wherein each of the plurality of chip packages further comprises:
   at least one passive element disposed on the redistribution structure, wherein the encapsulated material completely covers the at least one passive element.

7. The chip package array of claim 1, wherein the supporting structure is a reticular structure.

8. The chip package array of claim 1, wherein no conductive structure penetrates through the supporting structure.

9. The chip package array of claim 1, wherein the supporting structure is formed entirely of a same material.

10. The chip package array of claim 1, wherein a surface of the supporting structure away from the redistribution structure and a surface of the chip away from the redistribution structure are flush with each other.

11. The chip package array of claim 1, wherein a width from the first side surface to the second side surface at any side of the opening is equal to another width from the first side surface to the second side surface at another side of the opening opposite to the any side of the opening.

12. A chip package, comprising:
a redistribution structure;
a supporting structure formed in one continuous piece, disposed on the redistribution structure and having an opening, wherein the supporting structure comprises a top surface and a bottom surface opposite to the top surface, a first side surface connected with a first end of each of the top surface and the bottom surface and a second side surface connected with a second end of each of the top surface and the bottom surface, and a maximum thickness from the first side surface to the second side surface is greater than a maximum thickness from the top surface to the bottom surface;
a chip disposed on the redistribution structure and located in the opening; and
an encapsulated material located between the opening and the chip, wherein the encapsulated material is filled between the opening and the chip, and the chip, the supporting structure are respectively connected to the redistribution structure, the encapsulated material completely covers the top surface and the first side surface of the supporting structure and a top surface and side surfaces of the chip, and the supporting structure, the chip and the encapsulated material form a common plane, the encapsulated material directly contacts with the entire top surface and the first side surface of the supporting structure and the top surface and the side surfaces of the chip, the chip and the supporting structure have the same thickness, the top surface of the chip is coplanar with the top surface of the supporting structure, the top surface of the chip faces away from the redistribution structure and is an inactive surface, and a bottom surface of the chip faces toward the redistribution structure and is an active surface.

13. The chip package of claim 12, wherein the chip comprises at least one pad, and the redistribution structure is directly connected to the at least one pad.

14. The chip package of claim 12, wherein at least one of the chip and the supporting structure is exposed in the encapsulated material.

15. The chip package of claim 12, wherein the opening has an inner surface, the inner surface has a groove, and the encapsulated material is completely filled in the groove.

16. The chip package of claim 12, wherein the opening has an inner surface, and the inner surface is inclined in a direction away from the chip such that the encapsulated material is extended above the inner surface.

17. The chip package of claim 12, further comprising:
at least one passive element disposed on the redistribution structure, wherein the encapsulated material completely covers the at least one passive element.

18. The chip package of claim 12, wherein the supporting structure is exposed at a side of the chip package.

19. The chip package array of claim 12, wherein a surface of the supporting structure away from the redistribution structure and a surface of the chip away from the redistribution structure are flush with each other.

20. The chip package array of claim 12, wherein a width from the first side surface to the second side surface at any side of the opening is equal to another width from the first side surface to the second side surface at another side of the opening opposite to the any side of the opening.

* * * * *